(12) United States Patent
Brcka et al.

(10) Patent No.: US 10,066,293 B2
(45) Date of Patent: Sep. 4, 2018

(54) METHOD OF CLEANING THE FILAMENT AND REACTOR'S INTERIOR IN FACVD

(71) Applicant: Tokyo Electron Limited, Tokyo (JP)

(72) Inventors: Jozef Brcka, Austin, TX (US); Osayuki Akiyama, Rensselaer, NY (US)

(73) Assignee: Tokyo Electron Limited, Tokyo (JP)

( * ) Notice: Subject to any disclaimer, the term of this patent is extended or adjusted under 35 U.S.C. 154(b) by 804 days.

(21) Appl. No.: 14/525,902

(22) Filed: Oct. 28, 2014

(65) Prior Publication Data

US 2015/0044390 A1 Feb. 12, 2015

Related U.S. Application Data

(62) Division of application No. 12/731,467, filed on Mar. 25, 2010, now abandoned.

(51) Int. Cl.
| | |
|---|---|
| *B08B 7/00* | (2006.01) |
| *C23C 16/44* | (2006.01) |
| *C23C 16/46* | (2006.01) |
| *C23C 16/503* | (2006.01) |
| *C23C 16/52* | (2006.01) |
| *H01J 37/32* | (2006.01) |

(52) U.S. Cl.
CPC ........ *C23C 16/4405* (2013.01); *B08B 7/0035* (2013.01); *C23C 16/46* (2013.01); *C23C 16/503* (2013.01); *C23C 16/52* (2013.01); *H01J 37/32091* (2013.01); *H01J 37/32165* (2013.01); *H01J 37/32449* (2013.01); *H01J 37/32862* (2013.01); *H01J 37/32889* (2013.01)

(58) Field of Classification Search
None
See application file for complete search history.

(56) References Cited

U.S. PATENT DOCUMENTS

| | | | |
|---|---|---|---|
| 5,349,313 A | 9/1994 | Collins et al. | |
| 5,983,906 A * | 11/1999 | Zhao | C23C 16/4401 134/1.1 |
| 6,036,878 A * | 3/2000 | Collins | H01J 37/321 216/68 |
| 6,552,297 B2 * | 4/2003 | Blonigan | H01J 37/32174 118/723 E |
| 7,637,269 B1 | 12/2009 | Zin et al. | |

(Continued)

OTHER PUBLICATIONS

Faguet J, et al., "Novel Dielectric Deposition Technology for Advanced Interconnect with Air Gap." Extended Abstract of IITC Sapporo, Japan (Jun. 1-3, 2009) 3 pgs.

(Continued)

*Primary Examiner* — Katelyn B Whatley
(74) *Attorney, Agent, or Firm* — Wood Herron & Evans LLP

(57) ABSTRACT

A method of operating a filament assisted chemical vapor deposition (FACVD) system. The method includes depositing a film on a substrate in a reactor of the FACVD system. During the depositing, a DC power is supplied to a heater assembly to thermally decompose a film forming material. The method also includes cleaning the heater assembly, or an interior surface of the reactor, or both. During the cleaning, an alternating current is supplied to the heater assembly to energize a cleaning media into a plasma.

14 Claims, 8 Drawing Sheets

(56) References Cited

U.S. PATENT DOCUMENTS

| | | |
|---|---|---|
| 8,272,347 B2 | 9/2012 | Nasman et al. |
| 8,291,856 B2 | 10/2012 | Nasman et al. |
| 2008/0241377 A1* | 10/2008 | Faguet .................. C23C 16/452 427/248.1 |
| 2008/0271748 A1 | 11/2008 | De Vries et al. |
| 2009/0223452 A1 | 9/2009 | Nasman et al. |

OTHER PUBLICATIONS

Lee LH and KK Gleason, "Cross-Linked Organic Sacrificial Material for Air Gap Formation by Initiated Chemical Vapor Deposition." J Electrochem Soc. 155(4) G78-G86 (2008).

Brcka J, "Model of a Filament Assisted CVD Reactor." Consol Conference Boston, MA (Oct. 8-10, 2009) 22 pgs.

Zhou J, et al., "High-Temperature Stability of Nichrome in Reactive Environments." J Vac Sci Technol. A21(3) 756-761 (2003).

* cited by examiner

METHOD OF CLEANING THE FILAMENT AND REACTOR'S INTERIOR IN FACVD

CROSS REFERENCE TO RELATED APPLICATION

This application is a divisional application of co-pending U.S. patent application Ser. No. 12/731,467 filed Mar. 25, 2010 and entitled METHOD OF CLEANING THE FILAMENT AND REACTOR'S IN FACVD, the disclosure of which is incorporated herein by reference in its entirety as if completely set forth herein below.

TECHNICAL FIELD

The present invention relates to filament assisted chemical vapor deposition systems and, more particularly, to methods of cleaning the filament and reactor interior of the filament assisted chemical vapor deposition system.

BACKGROUND

Vapor deposition is a common technique used in forming thin films during the production of an integrated circuit (IC) in semiconductor device manufacturing. Vapor deposition is also useful in forming conformal thin films over and within features on a substrate.

Chemical vapor deposition (CVD) processes generally include the introduction of a continuous stream of film precursor vapor into a reactor containing the substrate on a substrate support, which is generally heated to an elevated temperature. The film precursor vapor comprises the principle atomic or molecular species that will ultimately form the thin film on the substrate. Film formation typically occurs when precursor vapor that is chemisorbed onto the heated surface of the substrate thermally decomposes and reacts. Additional gaseous components may be used to assist in the decomposing or reacting of the chemisorbed precursor vapor.

In plasma enhanced CVD (PECVD), a plasma is generated within the reactor and utilized to alter or enhance the film deposition mechanism. For example, plasma excitation may allow a particular film-forming reaction to proceed at substrate temperatures that are significantly lower than conventional CVD temperatures. While PECVD may be used to deposit a wide variety of films at this lower substrate temperature, the use of the plasma may result in high energy ion bombardment or vacuum ultraviolet (VUV) radiation of the substrate during film growth, either of which may result in dangling bonds, trapped free radicals within the deposited film, or damage to the substrate.

In filament assisted CVD (FACVD), the film precursor is decomposed by a resistively heated filament positioned within the process space. The resultant fragmented molecules adsorb and react on the surface of the substrate. Unlike PECVD, plasma formation is not necessary for the deposition process, making FACVD particularly advantageous in reducing damage to the substrate during the deposition process.

However, there continues to be needed improvements within FACVD. For example, film deposition is not limited to the surface of the substrate, but instead may extend to other internal surfaces of the reactor, including the resistively heated filament. These film deposits may peel off during a subsequent deposition process and contaminate the processed substrate. Therefore, it is highly important to provide clean internal surfaces of the reactor.

Moreover, the emissivity of the resistively heated filament changes with surface composition. In that regard, while the same DC power level may be used for various batches, the temperature of the resistively heated filament may, in reality, vary greatly with the addition of film, thereby affecting the decomposing of the film precursor and resultant rates of film deposition onto the substrate. Therefore, it would be advantageous to develop a method to sustain a clean resistively heated filament in order to standardize the operational conditions before each deposition process is initiated. Further, it would be of great benefit to incorporate the cleaning process into the normal operational process of the FACVD system to increase throughput, such as by in-situ cleaning between substrate or batch processing.

SUMMARY

In one illustrative embodiment, the present invention is directed to a method of operating a filament assisted chemical vapor deposition (FACVD) system. The method includes depositing a film on a substrate in a reactor of the FACVD system. During the depositing, a DC power is supplied to a heater assembly to thermally decompose film forming materials. The method also includes cleaning the heater assembly and interior surfaces of the reactor. During the cleaning, an alternating current is supplied to the heater assembly to energize a cleaning media into a plasma within the reactor. The interior surfaces of the reactor and the heater assembly are exposed to the plasma for a cleaning time.

The alternating current may be supplied by an AC power supply that operates in a frequency range of tens of Hz to about 1 kHz. Alternatively, the alternating current may be supplied by an RF power supply operating in a frequency range of about 3 kHz to about 100 MHz.

In another illustrative embodiment, the present invention is directed to a method of cleaning a FACVD system. The FACVD system includes a reactor enclosing a processing space, a substrate support positioned at a first end of the processing space, a gas delivery system positioned at a second end of the processing space, and a heater assembly positioned between the gas delivery system and the substrate support. At least one of an interior surface of the reactor or the heater assembly has a deposited film on it. The method includes flowing a cleaning media into the processing space and supplying an alternating current to the heater assembly. With sufficient power, the alternating current energizes at least a portion of the cleaning media into a plasma. The flowing and supplying continue for a cleaning time, during which at least a portion of the deposited film is etched from the interior surface or the heater assembly or both.

DETAILED DESCRIPTION

Figure 1:
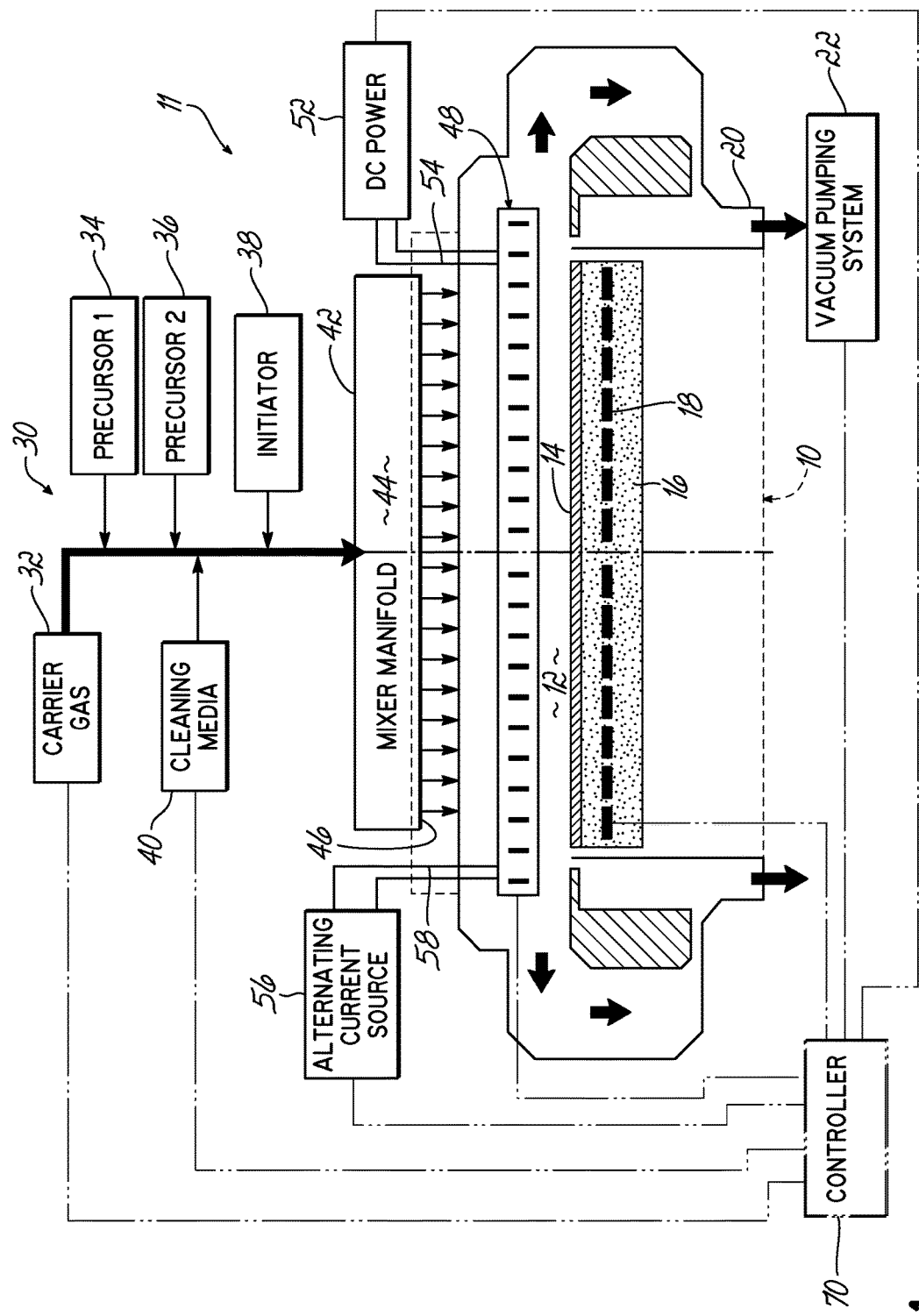
FIG. 1 is a diagrammatic view of one exemplary embodiment of a reactor for a FACVD system.

FIG. 1 illustrates a filament assisted chemical vapor deposition (FACVD) reactor 10 of a FACVD system 11 enclosing a processing space 12 for depositing a thin film onto a substrate 14 positioned on a substrate support 16. The substrate support 16 is situated in the reactor 10 on one side of the processing space 12 and supports the substrate 14 on the upper surface facing the processing space 12.

The substrate 14 may, for example, be a silicon (Si) substrate, such as an n- or p-type substrate, depending on the type of device to be formed. The substrate 14 may be of any size, for example 200 mm or 300 mm in diameter or larger. While only one substrate 14 is specifically illustrated, it would be understood that more than one substrate 14 may be processed simultaneously, such as during batch processing.

The substrate support 16 may include one or more temperature control elements 18 operable to control the temperature of the substrate 14 during operation of the reactor 10. The one or more temperature control elements 18 may include a substrate heating system, a substrate cooling system, or both. In one embodiment, the substrate heating and cooling systems may include a recirculating fluid flow for exchanging heat between the substrate support 16 and a heat exchanger system (not shown). In yet other embodiments, the heating and cooling systems may include resistive heating elements or thermo-electric heaters or coolers. The substrate heating and cooling systems may be arranged to include one or more thermal zones, for example, an inner zone and an outer zone, whereby the temperature of the one or more thermal zones may be independently controlled during the operation of the reactor 10.

The substrate support 16 may further include an electrical or mechanical substrate clamping system (not shown) to clamp the substrate 14 to the upper surface of the substrate support 16. One exemplary embodiment of a suitable clamping system may include an electrostatic chuck (ESC).

Additionally, the substrate support 16 may include a backside gas supply system to facilitate the delivery of a heat transfer gas (for example, helium) to the back-side of the substrate 14 to improve the gas-gap thermal conductance between the substrate 14 and the substrate support 16. The backside gas supply system may be utilized when additional control of an elevated or reduced temperature of the substrate 14 is required. The backside gas supply system may be separated into one or more delivery zones, whereby the pressure of the heat transfer gas may be independently varied between the one or more delivery zones.

The reactor 10 may further be coupled via a duct 20 to a vacuum pumping system 22 that is operable to evacuate the reactor 10 to an internal pressure during operation of the reactor 10. One exemplary vacuum pumping system 22 may include a turbo-molecular vacuum pump (TMP) capable of pumping speeds of up to about 5000 Liters per second ($Ls^{-1}$) and having a gate valve (not shown) that is operable to throttle the internal pressure as necessary. TMPs may be used for low pressure processes, i.e., those operating at less than about 1 Torr High pressure processes, i.e., those operating at greater than 1 Torr, may be accomplished with a mechanical booster pump or a dry roughing pump. Monitoring of the internal pressure may be accomplished with a pressure measuring device (not shown), for example, a Type 628B Baratron absolute capacitance manometer that is commercially available from MKS Instruments, Inc. (Andover, Mass.).

A gas delivery system 30 may be coupled to an end of the reactor 10 that opposes the substrate support 16 and is operable to introduce one or more gases into the reactor 10. The one or more gases may include film forming materials for forming a thin film on the substrate 14. Appropriate thin films may include a conductive film, a non-conductive film, semi-conductive films having various electrical properties, a dielectric film such as a low dielectric constant (low-k) film or an ultra-low-k film, diverse bio-compatible films and polymeric films, or for application as sacrificial layers in forming air gap dielectrics. Accordingly, the gas delivery system 30 includes a plurality of conduits coupling the reactor 10 to one or more material sources, each containing a different film forming material, such as a carrier gas 32, one or more precursors (first and second precursors 34, 36 are shown), initiators 38, or other gases as would be known to those of ordinary skill in the art. Precursors 34, 36 may include one or more chemical species, typically monomers, that are decomposed (to radicals or fragments), adsorbed onto the surface of the substrate 14, and reacted to form the film in a manner described in greater detail below. The initiator 38 may be included to assist with the film forming process, for example, by undergoing thermal decomposition and reacting with one of the two precursors 34, 36. Alternatively, the initiator 38 may perform as a catalyst thermally decomposing the precursors 34, 36. In other embodiments, a porogen (not shown) may be included that is operable to create pores within the deposited film. Still in other embodiments, a cross-linker (not shown) may be desired and included with the film forming materials. Exemplary chemistries may include those described in U.S. patent application Ser. Nos. 11/693,067; 12/044,574; and 12/511,832; the disclosures of which are incorporated herein by reference, in their entireties.

The carrier gas 32 may be used when one or more of the precursors includes a material that transforms from a non-gaseous state to a gaseous state, such as by sublimation or evaporation. Inert gases or dilution gases may also be used as necessary. Suitable carrier or dilution gases may include the noble gases, i.e., helium (He), neon (Ne), argon (Ar), krypton (Kr), xenon (Xe), or radon (Rn), or combinations thereof.

The one or more gases may also include additional chemical species to effectuate a particular process to be completed within the reactor 10, such as a cleaning media 40 described in greater detail below.

The gas delivery system 30 terminates at a mixer manifold 42, which provides a plenum 44 in which the film forming materials mix. The opposing end of the mixer manifold 42 includes a gas distribution plate 46 with a plurality of orifices (not shown) having shapes, numbers, and distributions selected for achieving a particular distribution of the one or more gases into the processing space 12. The mixer manifold 42 may be a showerhead assembly or other similar device that is known to one of ordinary skill in the art.

A heater assembly 48 is positioned within the processing space 12 between the gas distribution plate 46 and the substrate support 16 such that film forming materials flowing out of the gas distribution plate 46 may be thermally decomposed into radicals or fragments, and thus rendered reactive in a manner consistent with FACVD film deposition methods. The heater assembly 48, shown in greater detail in FIG. 2, may be a resistive heater comprising a plurality of ribbon conductor pairs $50_a$-$50_n$ that are powered in parallel by an external DC power source 52 via a DC circuitry 54. The DC power source 52 may be capable of voltage output of less than about 200 V and supplying power ranging from about 1 kW to about 5 kW such that the set of ribbon conductor pairs $50_a$-$50_n$ are capable of generating temperatures ranging from below 100° C. to about 1000° C. While any electrically-conductive material may be used for the set of ribbon conductor pairs $50_a$-$50_n$, nickel chromium is preferred. Ceramic posts 55 may be used to thermally and electrically insulate the plurality of ribbon conductor pairs $50_a$-$50_n$ from the walls of the reactor 10 (FIG. 1). Other configurations would be known and may include, for example, dynamic mounting devices to compensate for structural changes in the heater assembly 48 due to heating, such as those taught in U.S. patent application Ser. Nos. 12/044,574 and 12/559,398, the latter of which is incorporated herein by reference in its entirety.

The plurality of ribbon conductor pairs $50_a$-$50_n$ may also be powered in parallel by an external alternating current power source 56 through an alternating current circuitry 58 having one or more capacitors 60 disposed therein. One of ordinary skill would readily appreciate that the DC circuitry 54 should then include one or more chokes 64 therein. The one or more capacitors 60 and one or more chokes 64 ensure that the DC power source 52 and the alternating current power source 56 are electrically isolated and the heater assembly 48 may only be operated by either of the DC power source 52 or the alternating current power source 56 or both simultaneously.

Suitable alternating current power sources 56 include those operating within a frequency range of tens of kHz to about 100 MHz with power ranging from about 100 W to about 5 kW. While reference may be made to the various illustrations herein as including either one of an AC power supply or an RF power supply, one of ordinary skill in the art would readily appreciate that any alternating current power source may be used and would know how to properly adapt the particular circuitry configuration for operation within a different frequency range. One of ordinary skill in the art would readily appreciate that a matching network 68 (FIG. 7A) may be included when using an RF power supply, particularly those operating at higher frequencies, in order to minimize reflective power. Further details of the operation of the heater assembly 48 with the DC and alternating current power sources 52, 56 is described in greater detail below.

Referring still to FIG. 1, a controller 70 may be operably coupled to the reactor 10 to control one or more of the various systems (i.e., one or more of the temperature control elements 18, the substrate clamping system, the backside gas supply system, the vacuum pumping system 22, the gas delivery system 30, the DC power source 52 of the heater assembly 48, and the alternating current power source 56 of the heater assembly 48). Accordingly, the controller 70 may be a microprocessor having a memory and a digital I/O port that is capable of generating control voltages that are sufficient to communicate and activate inputs to one or more systems and to monitor outputs from the one or more systems. A program may be stored in the memory and may be operable to activate the inputs in accordance with a process recipe to achieve a particular process within the reactor 10. The controller 70 may be locally located relative to the reactor 10 or remotely located and operable via an intranet or the internet. For example, the controller 70 may be coupled to an intranet at a customer site (i.e., a device maker) or coupled to an intranet at a vendor site (i.e., an equipment manufacturer). Furthermore, a computer (i.e., a server, etc.) may be used to access the controller 70 for exchanging inputs and outputs therewith via at least one of a direct connection, an intranet, or the internet.

Figure 3:
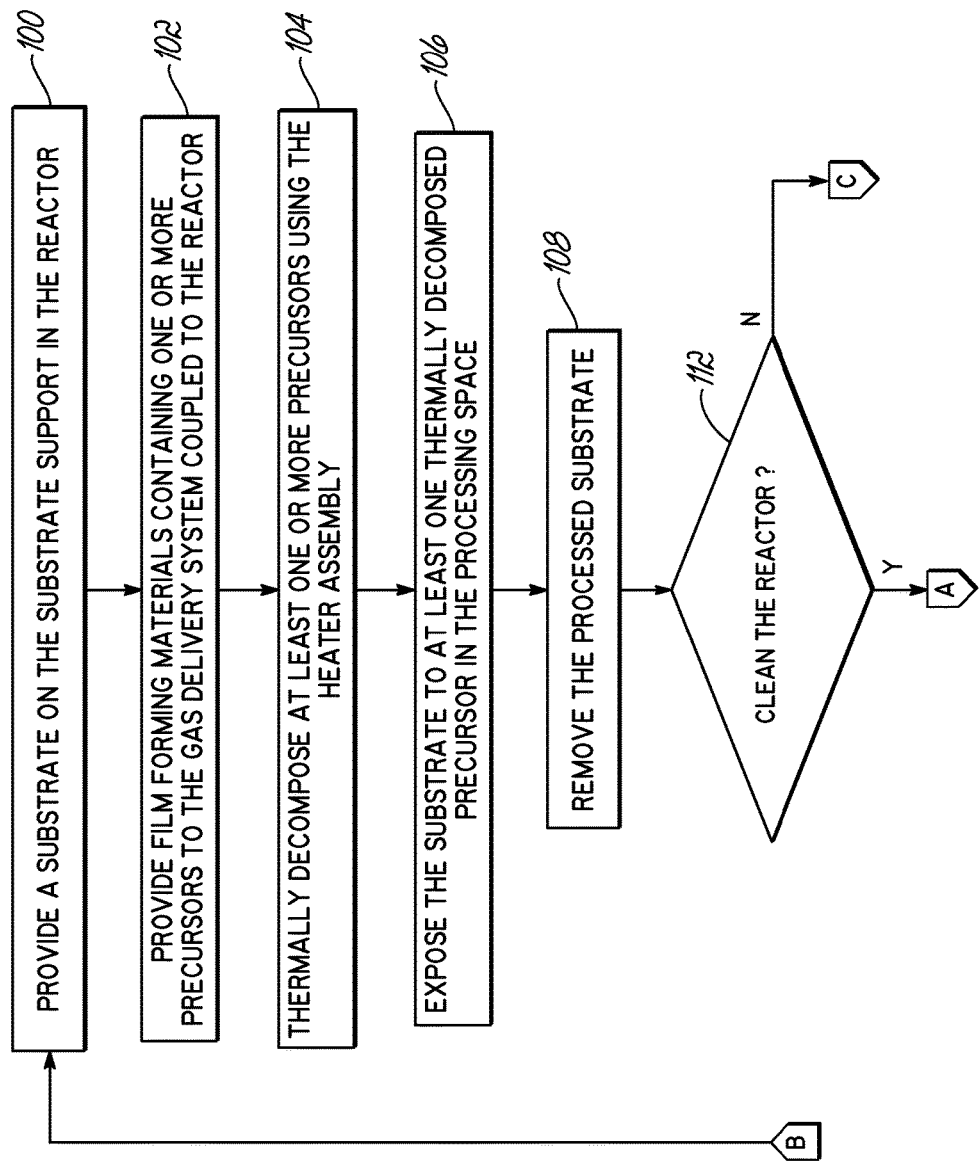
FIGS. 3-4 are flow charts illustrating successive steps of one exemplary method of operating the heater assembly of FIG. 2 in the reactor of FIG. 1.
Figure 4:
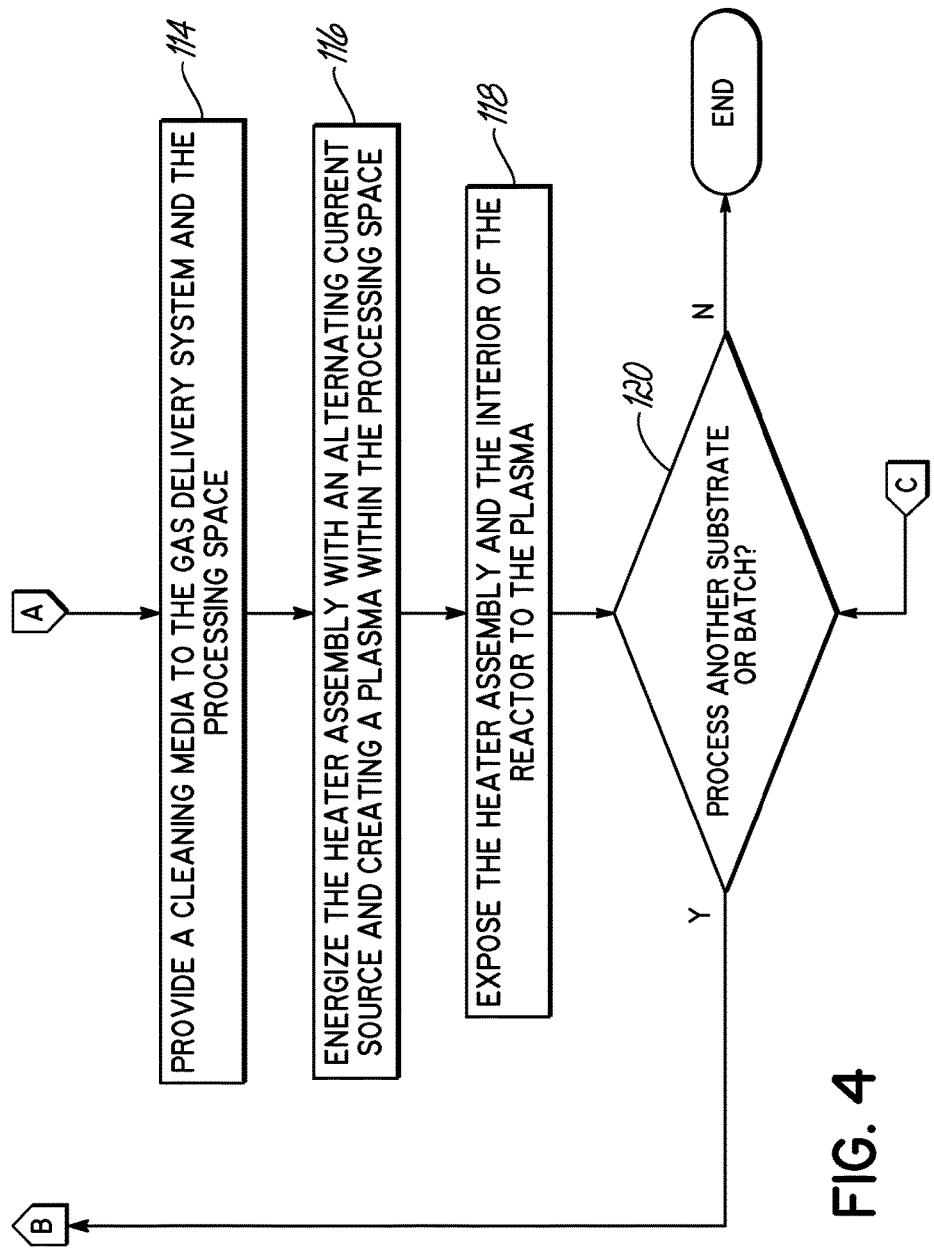
Figure 5:
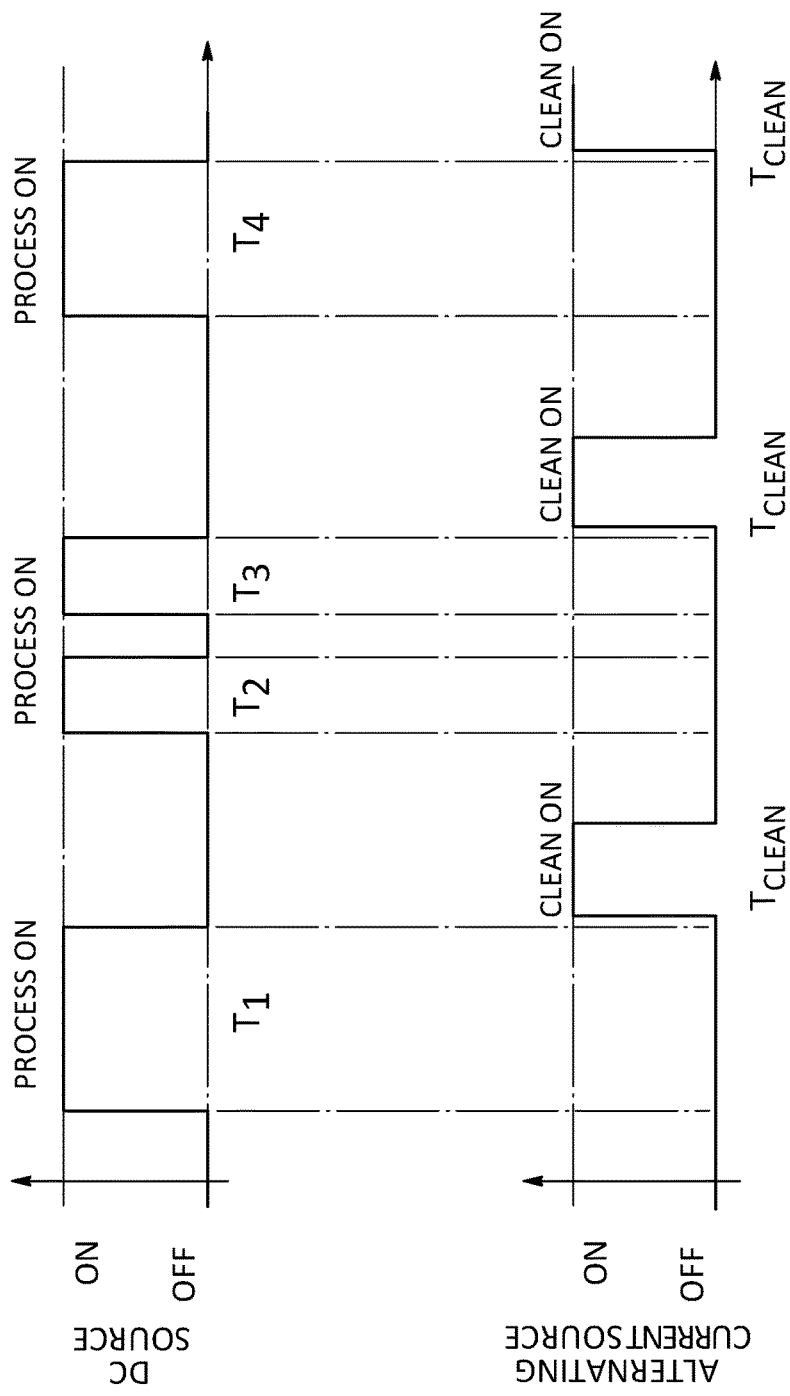
FIG. 5 is a timeline illustrating the operation of the heater assembly of FIG. 2 in accordance with the method of FIGS. 3-4.

Turning now to FIGS. 3-5, and with continued reference to the reactor 10 of FIG. 1, one illustrative method of operating the FACVD reactor 10 is shown. It would be understood that reactor designs may vary and that the particular illustrated embodiment of operating the FACVD system 11 would not be limited to the particular reactor designs or the particular methods described herein.

In the illustrated method of operating the FACVD reactor 10, the method begins at Step 100 with providing one or more substrates 14 onto the substrate support 16 in the reactor 10. The one or more substrates 14 may be moved into and out of the reactor 10 without breaking the vacuum seal of the reactor 10 by a transfer system (not shown), as is well-known in the art. The one or more substrates 14 may be unprocessed substrates, may be previously patterned to include one or more vias, or a combination thereof.

Once the one or more substrates 14 are so positioned, the method continues with providing film forming materials containing precursors 34, 36 to the gas delivery system 30 coupled to the reactor 10, at Step 102. As was described in greater detail above, the film forming materials may further include initiators 38, porogens, or other species that are desired to achieve a particular film formation on the substrate 14.

At about the time that the film forming materials are provided into the reactor 10, the DC power source 52 is energized, as shown in FIG. 5, for a time $T_1$, which corresponds to the film forming process time. It would be understood that the DC power source 52 may be activated prior to, simultaneously with, or just after, initiating the providing of the film forming materials to the gas delivery system 30. In that regard, as the film forming materials flow through the gas delivery system 30, are mixed within the plenum 44 of the mixer manifold 42, and flow out of the gas delivery system 30 through the orifices of the gas distribution plate 46 toward the heater assembly 48, at least one of the precursors are thermally decomposed into radicals or fragments by the heater assembly 48, at Step 104.

At Step 106, the substrate 14 is exposed to the at least one thermally decomposed precursor and other film forming materials to facilitate the formation of the thin film on the surface of the substrate 14. During the exposing, the film forming materials, including the now reactive thermally decomposed precursor, adsorb onto the surface of the substrate 14. Once adsorbed, the thermally decomposed precursor may undergo a particular film forming chemical reaction, such as polymerization, which may be facilitated by other chemical species within the film forming materials that also adsorb onto the surface of the substrate 14.

It would be understood that the temperature of the substrate 14 may be controlled via the temperature control elements 18 within the substrate support 16. Controlling the temperature of the substrate 14 may better facilitate or control the rate of the particular film forming chemical reaction, as would be known to those of ordinary skill in the art.

After the film forming process time is complete, the supply of the film forming materials to the gas delivery system 30 is terminated, the power applied to the heater assembly 48 by the DC power source 52 is terminated (refer to FIG. 5 showing the end of $T_1$), and the now processed substrate 14 may be removed from the reactor 10 by the transfer system (not shown) or other known means, as at Step 108.

Figure 2:
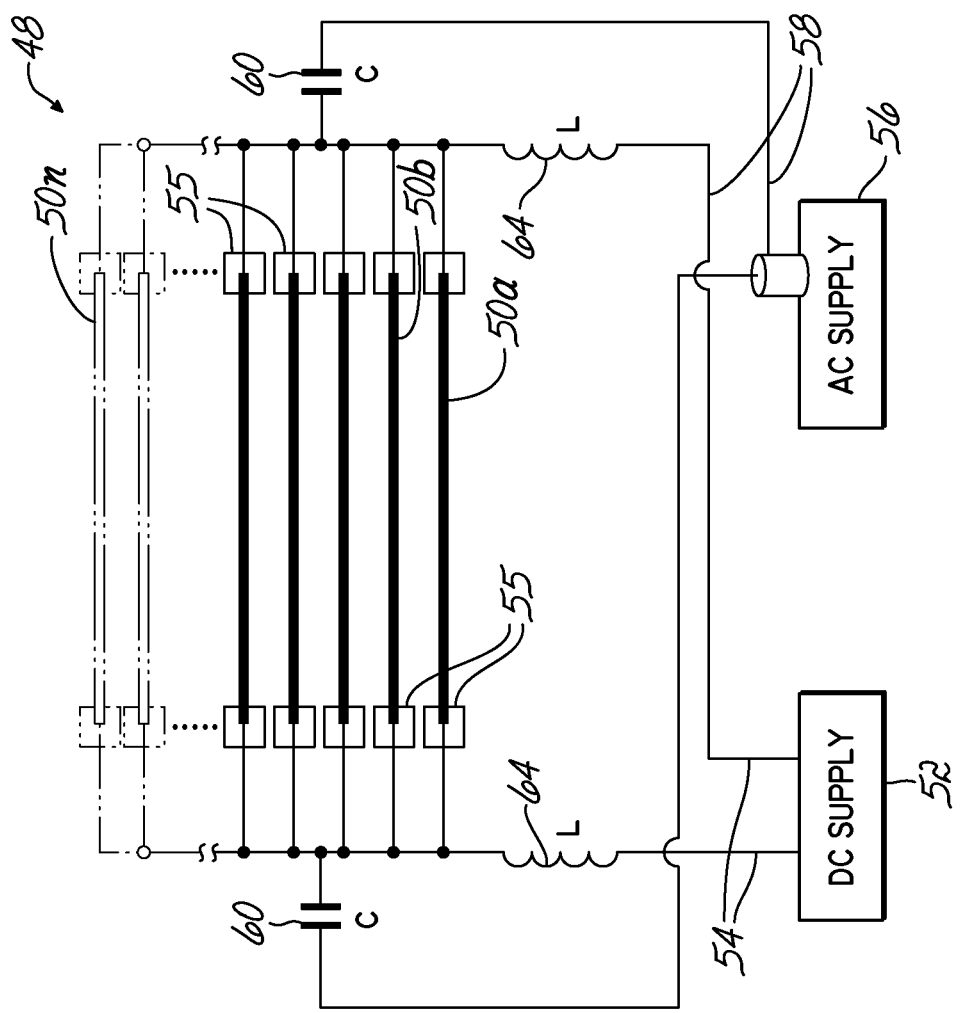
FIG. 2 is a diagrammatic view of one exemplary embodiment of a heater assembly for the reactor of the FACVD system.

During the film forming process time, adsorption and polymerization of the film forming materials is not limited to the surface of the substrate 14. Instead, the film forming process may proceed on any interior surface within the reactor 10, including the ribbon conductor pairs $50_a$-$50_n$ (FIG. 2) of the heater assembly 48. As had been described in greater detail above, deposition of the film onto the interior surfaces of the reactor 10 and the heater assembly 48 may lead to contamination of subsequent substrate processes or improper processing due to changes in the emissivity of the conductive metal material comprising the plurality of ribbon conductor pairs $50_a$-$50_n$ (FIG. 2). As a result and from time-to-time, a cleaning process may be required to eliminate the deposited film from the interior surfaces of the reactor 10 and the heater assembly 48.

In that regard, and continuing with reference to FIGS. 1 and 3-5, at Step 112, a decision is made as to whether to clean the reactor 10. The decision may be based on an operator command or a decision by the controller 70. The decision by the controller 70 may be based on a program recipe, a wafer count, or may be responsive to a sensor that monitors a state of a heater or the reactor 10. If the decision is to clean the reactor 10, then the method continues to Step 114 with providing the cleaning media 40 to the gas delivery system 30 and processing space 12. The cleaning media 40 may include various inert gases (such as Ar), reactive gases (such as oxygen; $O_2$), liquids such as solvents (for example, tetrafluoromethane; $CF_4$), or combinations thereof.

At Step 116, the heater assembly 48 is energized by the alternating current power source 56 and a plasma is created within the processing space 12. In that regard, as the cleaning media 40 flows through the gas delivery system 30 and flows out of the gas delivery system 30 through the orifices of the gas distribution plate 46 toward the heater assembly 48, some of the chemical species within the cleaning media 40 (for example, the Ar) are excited, thereby generating a low density plasma. This energizing by the alternating current power source 56 is also illustrated in FIG. 5, at a time $T_{clean}$, which corresponds to the cleaning process time.

At Step 118, the heater assembly 48 and the interior of the reactor 10 are exposed to the low density plasma for the cleaning process time to facilitate the etching of the deposited film on the interior surfaces of the reactor 10 or the heater assembly 48 or both. The etched film material may create volatile products or fragments that are pumped away from the reactor 10 through the duct 20 and the vacuum pumping system 22.

After the film forming process time is complete, the supply of the cleaning media 40 to the gas delivery system 30 is terminated, the power applied to the heater assembly 48 by the alternating current power source 56 is terminated (refer to FIG. 5 showing the end of $T_{clean}$), and the now clean reactor 10 is ready for additional processes. In Step 120, a decision is made as to whether to process another substrate or batch of substrates. Should another substrate or batch be desired, the method may continue by returning to Step 100.

FIG. 5 continues with a process comprising the sequence of a shortened film forming process time ($T_2$), another shortened film forming process time ($T_3$), a second cleaning process ($T_{clean}$), an extended film forming process ($T_4$), and a third cleaning process ($T_{clean}$). However, FIG. 5 is merely exemplary in nature and should not be construed as the only manner by which the operation of the reactor 10 may proceed.

Turning now to FIGS. 6A-7B, additional alternate embodiments for connecting an alternating current power supply to the heater assemblies are shown with greater detail. For example, in FIG. 6A, a heater assembly 140 is shown as including a plurality of ribbon conductor pairs $142_a$-$142_n$. The heater assembly 140 may be powered by a DC power supply 144 via a DC circuitry 146 having an inductor 148 disposed therein. Further as shown, the heater assembly 140 may be powered by an AC power supply 150 via an AC circuitry 152 through a transformer 154.

Typically, the heater is activated by DC power, but it may be heated by AC power, preferably at low frequencies, such as frequencies below 1 kHz. The cleaning power may be AC power at a frequency that is effective to ignite and sustain a plasma in the reactor 10 (FIG. 1). The cleaning power is preferably at a frequency high enough above the heating power to allow the heating and cleaning power source to be isolated and run simultaneously. Otherwise, the power supplies should be switchable. AC cleaning power is thus usually provided at high frequencies, such as within the RF range. The industrial frequency of 13.56 MHz is commonly acceptable for the cleaning power source.

Figure 6A:
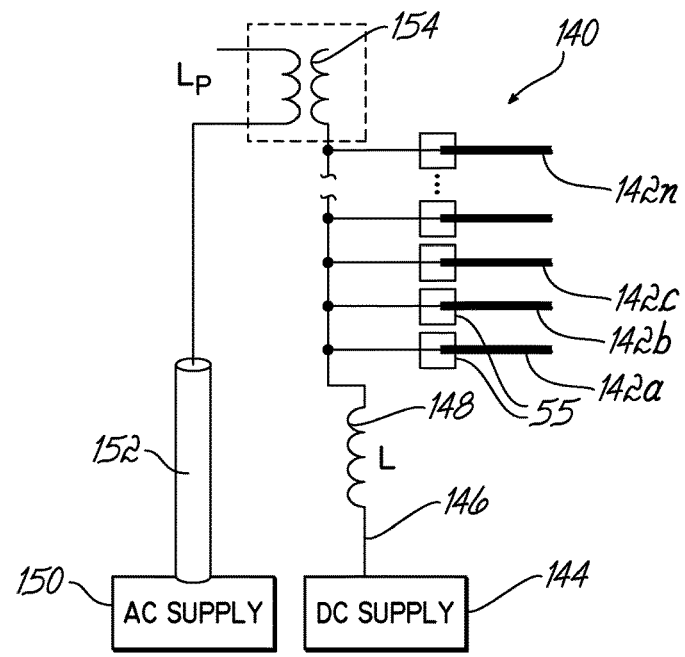
FIGS. 6A-6B are diagrammatic views of alternate embodiments of heater assemblies.
Figure 6B:
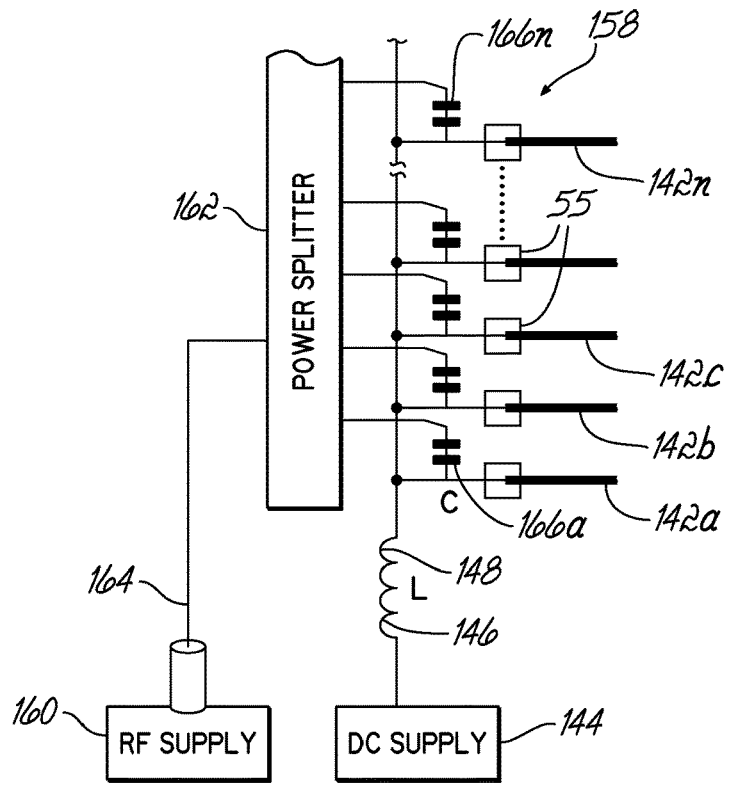

Alternatively, in FIG. 6B, where like reference numerals refer to like components, a heater assembly 158 is shown and includes an RF power supply 160 coupled to a power splitter 162 within an RF circuitry 164. The presence of the power splitter 162 enables an RF power from the RF power supply 160 to be supplied, in parallel, to each of a plurality of capacitors $166_a$-$166_n$ corresponding to the plurality of ribbon conductor pairs $142_a$-$142_n$. This particular arrangement may be particularly beneficial when utilizing alternating current power sources that operate at frequencies that exceed 1 MHz.

Figure 7A:
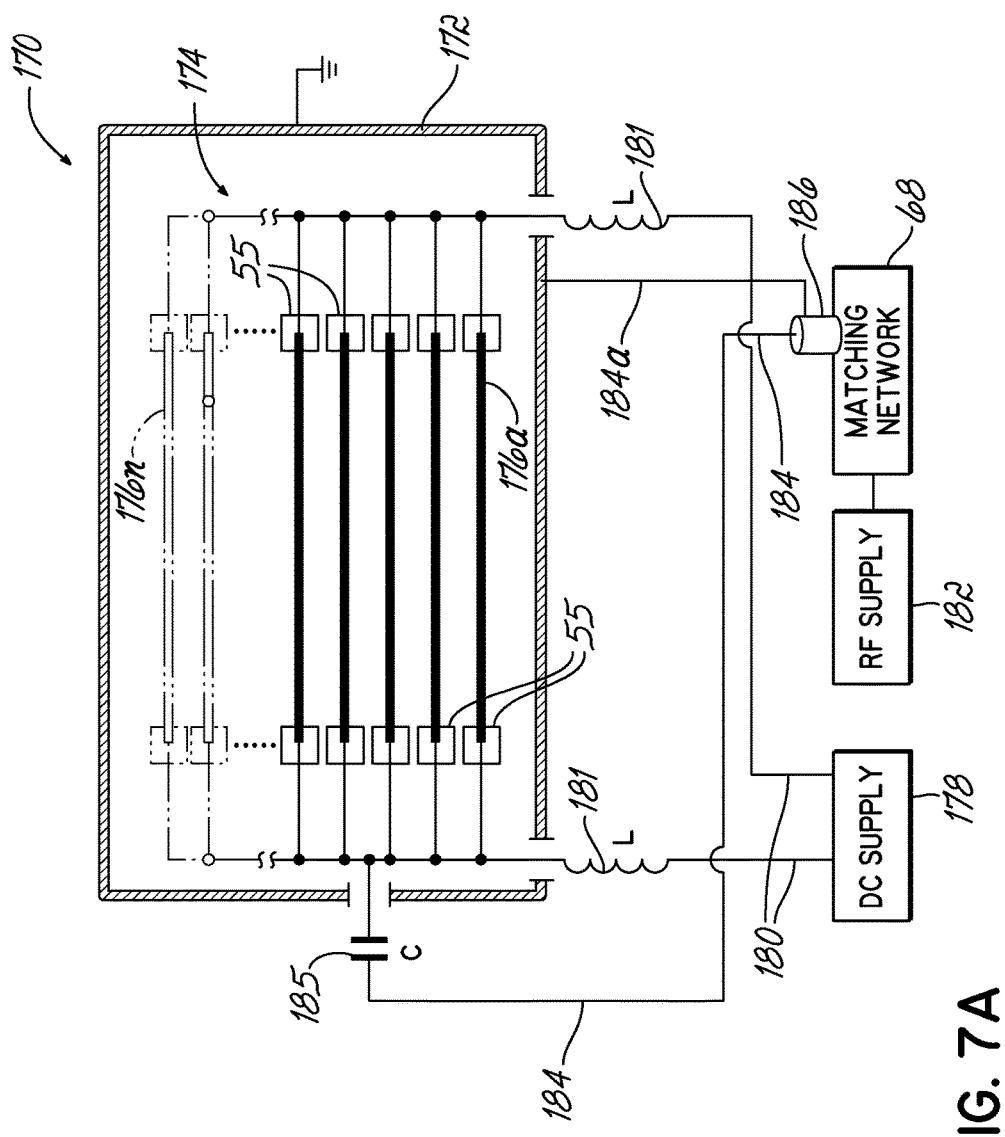
FIGS. 7A-7B are diagrammatic views of alternate embodiments of a reactor and a heater assembly.

In FIG. 7A, a reactor 170 is shown wherein the walls 172 of the reactor 170 are constructed from a metallic material. The heating assembly 174 positioned within the reactor 170 includes a plurality of ribbon conductor pairs $176_a$-$176_n$ that are coupled to a DC power supply 178 via a DC circuitry 180 through inductors 181, which allow the DC power to pass to the heating assembly 174 while isolating the DC power supply 178 from RF energy applied to the ribbon conductor pairs $176_a$-$176_n$. An RF power supply 182 applies RF energy to the heating assembly 174 through a matching network 68 via an RF power conductor 184, where the RF power conductor 184 and ground pole 184a are enclosed by a shield 186. A grounding pole 184a of the RF power supply 182 and the matching network 68 may be coupled to the grounded wall 172 of the reactor 170. In this embodiment, the RF power is applied between the heating assembly 174 and the grounded wall 172 to excite a plasma by capacitively coupling around the ribbon conductor pairs $176_a$-$176_n$ for cleaning the ribbon conductor pairs $176_a$-$176_n$ or other interior surfaces of the reactor 170.

Figure 7B:
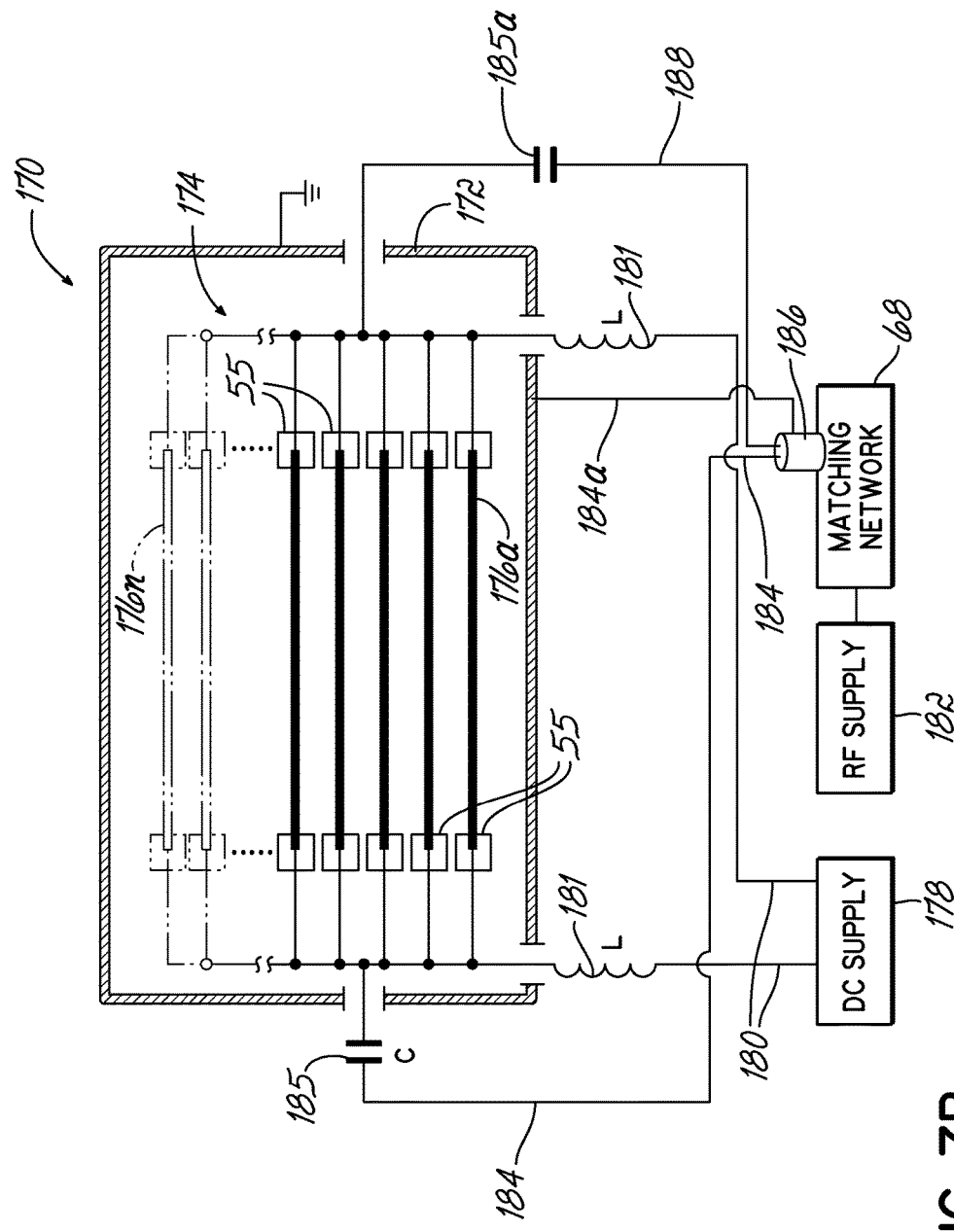

In an alternative embodiment, shown in FIG. 7B, the RF power supply 182 is coupled directly across the heating assembly 174 with RF power conductors 184, 188 through capacitors 185 and 185a, respectively. The capacitors 185 and 185a pass the RF energy from the RF power supply 182 to the heating assembly 174 while isolating the RF power supply 182 from the DC power applied to the heating assembly 174. In this embodiment, the RF energy across the ribbon conductor pairs $176_a$-$176_n$, along with capacitive coupling between the ribbon conductor pairs $176_a$-$176_n$ and the grounded wall 172, produce the plasma around the heating assembly 174 and interior surfaces of the reactor 170 for cleaning.

While the present invention has been illustrated by a description of various embodiments, and while these embodiments have been described in some detail, they are not intended to restrict or in any way limit the scope of the appended claims to such detail. Additional advantages and modifications will readily appear to those skilled in the art. The various features of the invention may be used alone or in any combination depending on the needs and preferences of the user. This has been a description of the present invention, along with methods of practicing the present invention as currently known. However, the invention itself should only be defined by the appended claims.

What is claimed is:

1. A method of operating a filament assisted chemical vapor deposition (FACVD) system, the method comprising:
   (i) depositing a film on a substrate positioned on a substrate support in a reactor of the FACVD system, wherein the depositing comprises:
      (a) flowing film forming materials including a precursor to a gas delivery system to distribute the film forming materials to a processing space within the reactor;
      (b) supplying DC power through a DC power supply to a heater assembly positioned between the gas delivery system and the substrate support, wherein the DC power is sufficient to thermally decompose the film forming materials into the film;
      (c) continuing the flowing of the film forming materials and the supplying of the DC power for a deposition time; then
      (d) terminating the flowing of the film forming materials and the supplying of the DC power after the deposition time has lapsed; and
      (e) removing the substrate from the reactor; and
   (ii) cleaning the heater assembly and interior surfaces of the reactor of the FACVD system after the substrate is removed from the reactor, wherein the cleaning comprises:
      (a) flowing a cleaning media into the processing space;
      (b) supplying an alternating current to the heater assembly with an RF power supply and through at least one capacitor, the alternating current supplied at a power level that is sufficient to energize the cleaning media into a cleaning plasma, the RF power supply being coupled to the heater assembly in parallel with the DC power supply; and
      (c) electrically isolating the DC power supply from the RF power supply with at least one choke and the at least one capacitor when alternating current is supplied to the heater assembly during the cleaning time;
      (d) exposing the interior surfaces of the reactor and the heater assembly to the cleaning plasma for a cleaning time, thereby etching the film deposited on at least one interior surface of at least one of the reactor and the heater assembly.

2. The method according to claim 1, further comprising: supplying the alternating current from the RF power supply operating within a frequency range of 3 MHz to 100 MHz.

3. The method according to claim 1, wherein the RF power supply is coupled to the heater assembly by two or more capacitors in parallel.

4. The method according to claim 3, further comprising: supplying the alternating current from the RF power supply to a power splitter and splitting the alternating current to the two or more capacitors in parallel and thereafter to the heater assembly with the power level that is sufficient to energize the cleaning media into the cleaning plasma.

5. The method according to claim 3, further comprising: electrically isolating the alternating current supplied by the RF power supply to the heater assembly from the DC power from the DC power supply by splitting the alternating current to the two to or more capacitors in parallel.

6. The method according to claim 4, wherein the RF power supply further includes a matching network that is coupled to the RF power supply and the power splitter.

7. The method according to claim 1, wherein the film is deposited onto a batch that includes two or more substrates.

8. The method according to claim 1, wherein the heater assembly includes a plurality of ribbon conductor pairs.

9. The method according to claim 8, wherein the plurality of ribbon conductor pairs are electrically connected in parallel.

10. The method according to claim 1, wherein the walls of the reactor are constructed from a metallic material, and wherein a grounding port of the RF power supply is coupled to the walls of the reactor.

11. The method according to claim 1, wherein the film forming materials further include an initiator, a carrier gas, a porogen, a catalyst, or a cross-linker, or a combination thereof.

12. The method according to claim 1, wherein the cleaning media includes inert gases, reactive gases, or solvents, or a combination thereof.

13. The method according to claim 12, wherein one of the solvents is tetrafluoromethane.

14. The method according to claim 1, wherein the etching generates a volatile product, the method further comprises:
   (e) evacuating the volatile product from the reactor through a vacuum pumping system coupled to the reactor.

* * * * *